United States Patent
Zinn

(10) Patent No.: US 8,900,704 B1
(45) Date of Patent: Dec. 2, 2014

(54) NANOSTRUCTURED METAL-DIAMOND COMPOSITE THERMAL INTERFACE MATERIAL (TIM) WITH IMPROVED THERMAL CONDUCTIVITY

(75) Inventor: Alfred A. Zinn, Palo Alto, CA (US)

(73) Assignee: Lockheed Martin Corporation, Bethesda, MA (US)

( * ) Notice: Subject to any disclaimer, the term of this patent is extended or adjusted under 35 U.S.C. 154(b) by 915 days.

(21) Appl. No.: 12/536,453

(22) Filed: Aug. 5, 2009

Related U.S. Application Data

(60) Provisional application No. 61/086,446, filed on Aug. 5, 2008.

(51) Int. Cl.
B32B 5/16 (2006.01)
B32B 9/00 (2006.01)
B32B 15/02 (2006.01)
H05K 7/20 (2006.01)

(52) U.S. Cl.
USPC ............................................ 428/402; 361/708

(58) Field of Classification Search
USPC .................................. 428/402–407; 165/185
See application file for complete search history.

(56) References Cited

U.S. PATENT DOCUMENTS

| | | | |
|---|---|---|---|
| 5,159,171 A | 10/1992 | Cook et al. | |
| 5,614,320 A * | 3/1997 | Beane et al. | 428/403 |
| 6,645,444 B2 | 11/2003 | Goldstein | |
| 7,559,970 B2 | 7/2009 | Kim et al. | |
| 7,628,840 B2 | 12/2009 | Atsuki et al. | |
| 7,847,397 B2 | 12/2010 | Wu et al. | |
| 7,850,933 B2 | 12/2010 | Yang et al. | |
| 7,858,025 B2 | 12/2010 | Shim et al. | |
| 2003/0106160 A1 * | 6/2003 | Sun et al. | 8/115.51 |
| 2004/0105980 A1 * | 6/2004 | Sudarshan et al. | 428/404 |
| 2004/0166306 A1 * | 8/2004 | Black et al. | 428/325 |
| 2007/0202304 A1 | 8/2007 | Golovko et al. | |
| 2008/0089836 A1 * | 4/2008 | Hainfeld | 424/1.11 |
| 2008/0124566 A1 * | 5/2008 | Smallman et al. | |

(Continued)

FOREIGN PATENT DOCUMENTS

WO WO 2009/115643 A2 9/2009
WO WO 2010/036114 A2 4/2010

OTHER PUBLICATIONS

J.B Correia, Bulk Copper-nanodiamond Nanocomposites; Processing and Properties, Jun. 2008.*

(Continued)

Primary Examiner — Ronak Patel
(74) Attorney, Agent, or Firm — McDermott Will & Emery LLP

(57) ABSTRACT

Various aspects of the disclosure provide thermal interface materials having high thermal conductivities. In one aspect, a thermal interface material comprises metal-diamond composite nanoparticles, where each composite nanoparticle comprises a diamond core surrounded by a metal shell with a low fusion temperature. In one aspect, a thermal interface is formed between two surfaces (e.g., surfaces of a heat source and heat sink) by applying the thermal interface material between the two surfaces and heating the thermal interface material to the fusion temperature of the metal shells. The heating causes the metal shells to fuse together and to the two surfaces. The fusion results in a thermal interface between the two surfaces comprising a metal layer formed by the fused metal shells and the diamond cores embedded within the metal layer. The high thermal conductivity of the embedded diamond cores greatly enhance the thermal conductivity of the thermal interface.

7 Claims, 8 Drawing Sheets

(56) References Cited

U.S. PATENT DOCUMENTS

| | | | |
|---|---|---|---|
| 2008/0193318 A1* | 8/2008 | Carty | 419/2 |
| 2008/0272331 A1* | 11/2008 | Mohapatra et al. | 428/402.24 |
| 2008/0278181 A1 | 11/2008 | Zhong et al. | |
| 2009/0214764 A1 | 8/2009 | Li et al. | |
| 2009/0301606 A1 | 12/2009 | Ueshima | |

OTHER PUBLICATIONS

He et al. Preparation and Characterization of Diamond Nanometer Composite Powder Wrapped in an Extra thin Copper Film, 2004.*
English Abstract of SE 2002/01972, Dec. 2003, Kirsanov et al.*
English Translation of JP 2004-197153, Nishida et al., Jul. 2004.*
R. Meyer, et al., "Capillary Pressure and Phonons in Ag, Au, Cu and Ni Nanoparticles", Department de Physique, Universite de Montreal.
G. Jiang, et al., "The Size Dependence of the Diamond-Graphite Transition", J. Phys: Condense. Matter 12 (2000) pp. 5623-5627.
Howard L. Davidson, et al., "Copper-Diamond Composite Substrates for Electronic Comonents", IEEE Electronic Components and Technology Conference, 1995 Proceedings, 45th, May 21-24, 1995, pp. 538-541.
Erich Neubauer, et al., "Advanced Composite Materials With Tailored thermal Properties for Heat Sink Applications", IEEE.
Kanninen, et al., "Influence of Ligand Structure on the Stability and Oxidation of Copper Nanoparticles", Journal of Colloid and Interface Science, 2008, pp. 88-95, 318.
Lisiecki, et al., "Control of the Shape and the Size of Copper Metallic Particles", J. Phys. Chem., 1996, pp. 4160-4166, 100-10.
Mott, et al., "Synthesis of Size-Controlled and Shaped Copper Nanoparticles", Langmuir, 2007, pp. 5740-5745, 23-10.
Wu, et al., "Simple One-Step Synthesis of Uniform Disperse Copper Nanoparticles", Mater. Res. Soc. Symp. Proc., 2005, pp. Z6.3.1-Z6.3.6, 879E.
Wu, et al., "One-Step Green Route to Narrowly Dispersed Copper Nanocrystals", Journal of Nanoparticle Research, 2006, pp. 965-969, 8.
Yeshchenko, et al., "Size-Dependent Melting of Spherical Copper Nanoparticles Embedded in a Silica Matrix", Physical Review B, 2007, pp. 085434-1-085434-6, 75.
Pulkkinen, et al., "Poly(ethylene imine) and Tetraethylenepentamine as Protecting Agents for Metallic Copper Nanoparticles", Applied Materials & Interfaces, 2009, pp. 519-525, 1-2.
Correia, et al., "Bulk Copper-Nanodiamond Nanocomposites; Processing and Properties", Jun. 2008.
Shandiz, "Effective Coordination Number Model for the Size Dependency of Physical Properties of Nanocrystals", Journal of Physics: Condensed Matter, 2008, pp. 1-9, 20-325237.
Mirjalili, et al., "Prediction of Nanoparticles' Size-Dependent Melting Temperature Using Mean Coordination Number Concept", Journal of Physics and Chemistry of Solids, 2008, pp. 2116-2123, 69.

* cited by examiner

NANOSTRUCTURED METAL-DIAMOND COMPOSITE THERMAL INTERFACE MATERIAL (TIM) WITH IMPROVED THERMAL CONDUCTIVITY

RELATED APPLICATION

The present application claims the benefit of priority under 35 U.S.C. §119 from U.S. Provisional Patent Application Ser. No. 61/086,446, entitled "NANOSTRUCTURED METAL-DIAMOND COMPOSITE THERMAL INTERFACE MATERIAL (TIM) WITH IMPROVED THERMAL CONDUCTIVITY," filed on Aug. 5, 2008, which is hereby incorporated by reference in its entirety for all purposes.

STATEMENT REGARDING FEDERALLY SPONSORED RESEARCH OR DEVELOPMENT

Not Applicable.

FIELD OF THE INVENTION

This disclosure relates generally to thermal interface materials and, more particularly to nanostructured metal-diamond composite thermal interface materials.

BACKGROUND OF THE INVENTION

Thermal interface materials are used in many applications to transfer heat from heat-generating components in a system to a heat sink, heat spreader or other heat-removing device to remove heat from the components and prevent overheating of the components. For example, in electronic applications, thermal interface materials are used to transfer heat from heat-generating electronic components (e.g., microprocessor chip) to heat sinks. In space applications, thermal interface materials are used to transfer heat from heat-generating components of a satellite to heat pipes.

Thermal greases and thermal epoxies are commonly used for thermal interface materials. However, these thermal interface materials typically have low thermal conductivities of only 1-5 W/m·K, which limit their ability to remove heat from heat-generating components to heat-removing devices.

Therefore, there is a need for thermal interface materials having high thermal conductivities to improve removal of heat from heat-generating components.

SUMMARY OF THE INVENTION

Various aspects of the disclosure provide thermal interface materials having high thermal conductivities. In one aspect, a thermal interface material comprises metal-diamond composite nanoparticles, where each composite nanoparticle comprises a diamond core surrounded by a metal shell with a low fusion temperature. In one aspect, a thermal interface is formed between two surfaces (e.g., surfaces of a heat source and heat sink) by applying the thermal interface material between the two surfaces and heating the thermal interface material to the fusion temperature of the metal shells. The heating causes the metal shells to fuse together and to the two surfaces. The fusion results in a thermal interface between the two surfaces comprising a metal layer formed by the fused metal shells and the diamond cores embedded within the metal layer. The high thermal conductivity of the embedded diamond cores greatly enhance the thermal conductivity of the thermal interface.

BRIEF DESCRIPTION OF THE DRAWINGS

The accompanying drawings, which are included to provide further understanding of the invention and are incorporated in and constitute a part of this specification, illustrate aspects of the invention and together with the description serve to explain the principles of the invention.

DETAILED DESCRIPTION OF THE INVENTION

Figure 1:
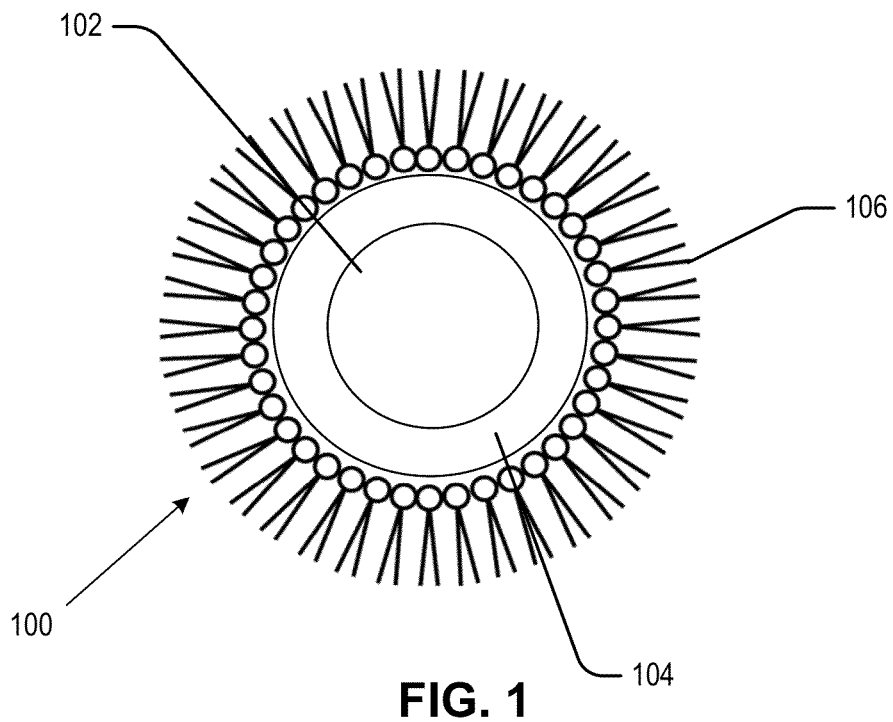
FIG. 1 is a conceptual illustration of a metal-diamond nanoparticle according to an aspect of the present disclosure.

In the following detailed description, numerous specific details are set forth to provide a full understanding of the subject technology. It will be obvious, however, to one ordinarily skilled in the art that the subject technology may be practiced without some of these specific details. In other instances, well-known structures and techniques have not been shown in detail to avoid obscuring concepts of the subject technology.

Reference will now be made in detail to aspects of the subject technology, examples of which are illustrated in the accompanying drawings, wherein like reference numerals refer to like elements throughout.

Various aspects of the disclosure provide thermal interface materials having high thermal conductivities. In one aspect, a thermal interface material comprises metal-diamond composite nanoparticles having core/shell structures. Each composite nanoparticle includes a diamond core surrounded by a metal shell, which may comprise copper, silver, gold, aluminum, tin or a combination thereof. The composite nanoparticles may be coated with a surfactant to stabilize the composite nanoparticles and to provide oxidation protection. The thermal interface material may also include organic solvents and/or other solutions mixed with the composite nanoparticles to form a "paint-like" solution or paste that allows the thermal interface material to be easily applied between two surfaces (e.g., a chip surface and a heat sink surface) for which a thermal interface is desired.

After the thermal interface material is applied between the two surfaces, the thermal interface material may be heated so that the metal shells of the composite nanoparticles fuse together and to the two surfaces. As discussed further below, the metal shells of the composite nanoparticles fuse together at much lower temperatures than the melting temperature of non-nanoparticle or bulk metal. Heating of the thermal interface material also drives out organic solvents and surfactants from the thermal interface material. After heating, the thermal interface material forms a thermal interface comprising the fused metal shells, which form a metal layer bonded to the two surfaces, and the diamond cores embedded within the metal layer.

The diamond cores can have thermal conductivities of 2000 W/m·K or higher, which greatly enhances the thermal conductivity of the thermal interface. As a result, the thermal conductivity of the thermal interface can be as high as 1350 W/m·K based on a 50% diamond volume fraction. The metal layer formed by the fused metal shells functions as a glue that bonds the high thermally conductive diamond cores with the two surfaces, thereby providing a thermal interface having a high thermal conductivity.

FIG. 1 illustrates the structure of an exemplary metal-diamond composite nanoparticle 100 according to certain aspects of the disclosure. The composite nanoparticle 100 comprises a diamond core 102, a metal shell 104 surrounding the diamond core 102 and a surfactant coating 106. The diamond core 102 comprises carbon atoms arranged in a crystalline structure. The diamond core 102 may have a thermal conductivity of 2000 W/m·K or higher and a diameter of 500 nanometers or less. The metal shell 104 may be made of a metal nanomaterial comprising metal nanoparticles such as copper nanoparticles, silver nanoparticles, gold nanoparticles, aluminum nanoparticles, tin nanoparticles or a combination thereof. The metal shell 104 may have a thickness around 2 nanometers (nm) or less. For example, for composite nanoparticles on the order of 5 nm or less in diameter, the shell thickness may be around one nm or less, and for larger composite nanoparticles on the order of 5 nm to 10 nm in diameter, the shell thickness may be around one to two nm. Examples of processes for forming the composite nanoparticle 100 are provided below.

In one aspect, a low fusion temperature for the metal shell 104 is achieved using the property that the fusion temperature of nanomaterials drop with reduction in particle size. The term "fusion temperature" may refer to a temperature at which the nanomaterial liquefies, giving the appearance of melting. For example, rhenium nanoparticles having a diameter of between 5 and 25 nanometers exhibit a fusion temperature of about 600-800° C., which is a significant reduction from the 3180° C. melting temperature of non-nanoparticle or bulk rhenium. Similarly, copper also exhibits a similar property in that the fusion temperature of copper nanoparticles (or copper nanomaterial) is significantly lower in comparison to the melting temperature of non-nanoparticle or bulk copper, which is about 1083° C. Other metal nanomaterials also exhibit a reduction in fusion temperature in comparison to the melting temperature of the corresponding non-nanoparticle or bulk metal. Generally speaking, lower diameter nanoparticles have a lower fusion temperature. For example, the fusion temperature of a copper nanomaterial, having an average nanoparticle diameter in the 2-5 nanometer range can have a fusion temperature of approximately 200° C. and as low as 150° C., which is significantly lower than the 1083° C. melting temperature of bulk copper.

Figure 7A:
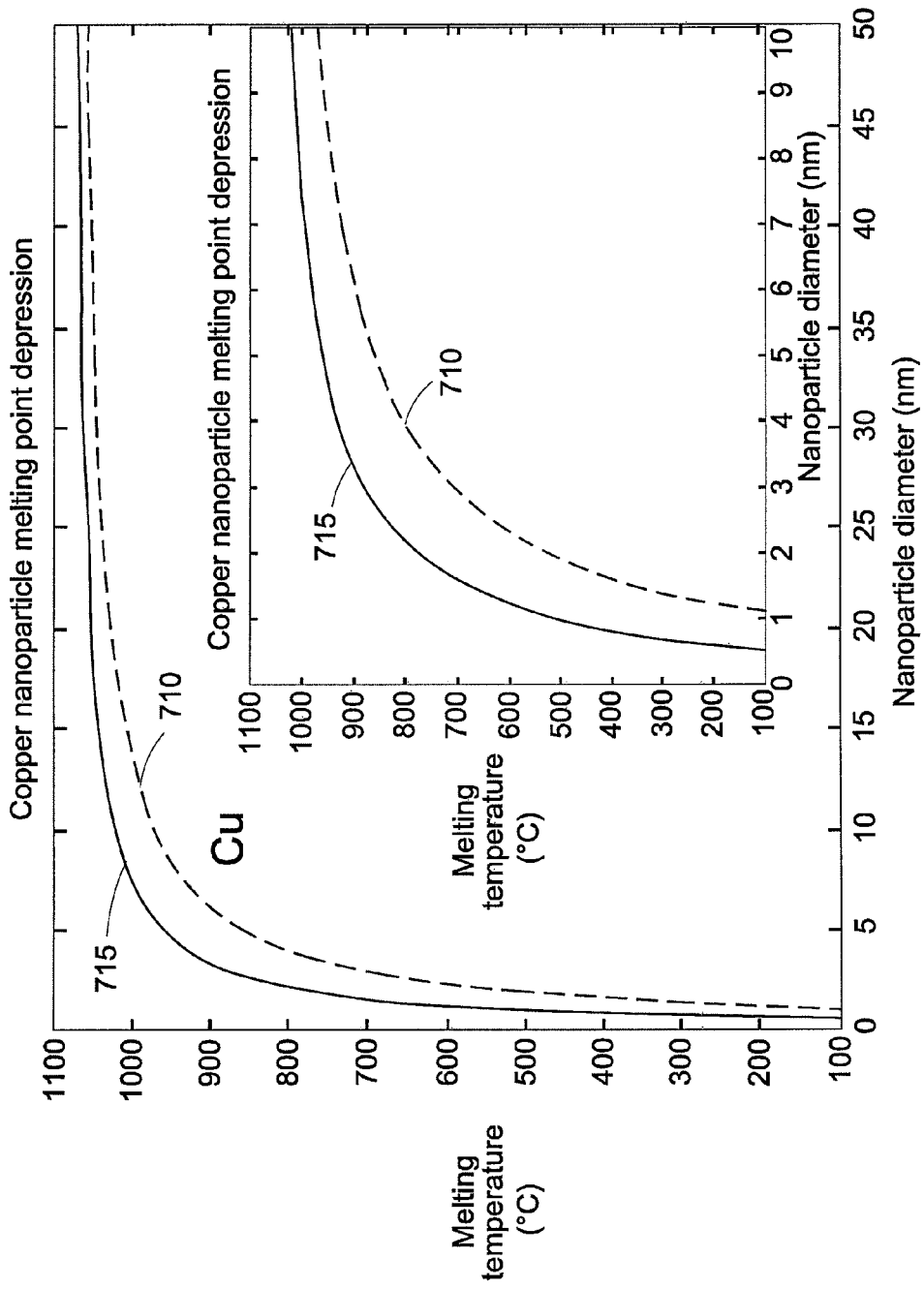
FIGS. 7A and 7B are graphs showing exemplary plots of melting temperature versus nanoparticle diameter for copper and aluminum, respectively.
Figure 7B:
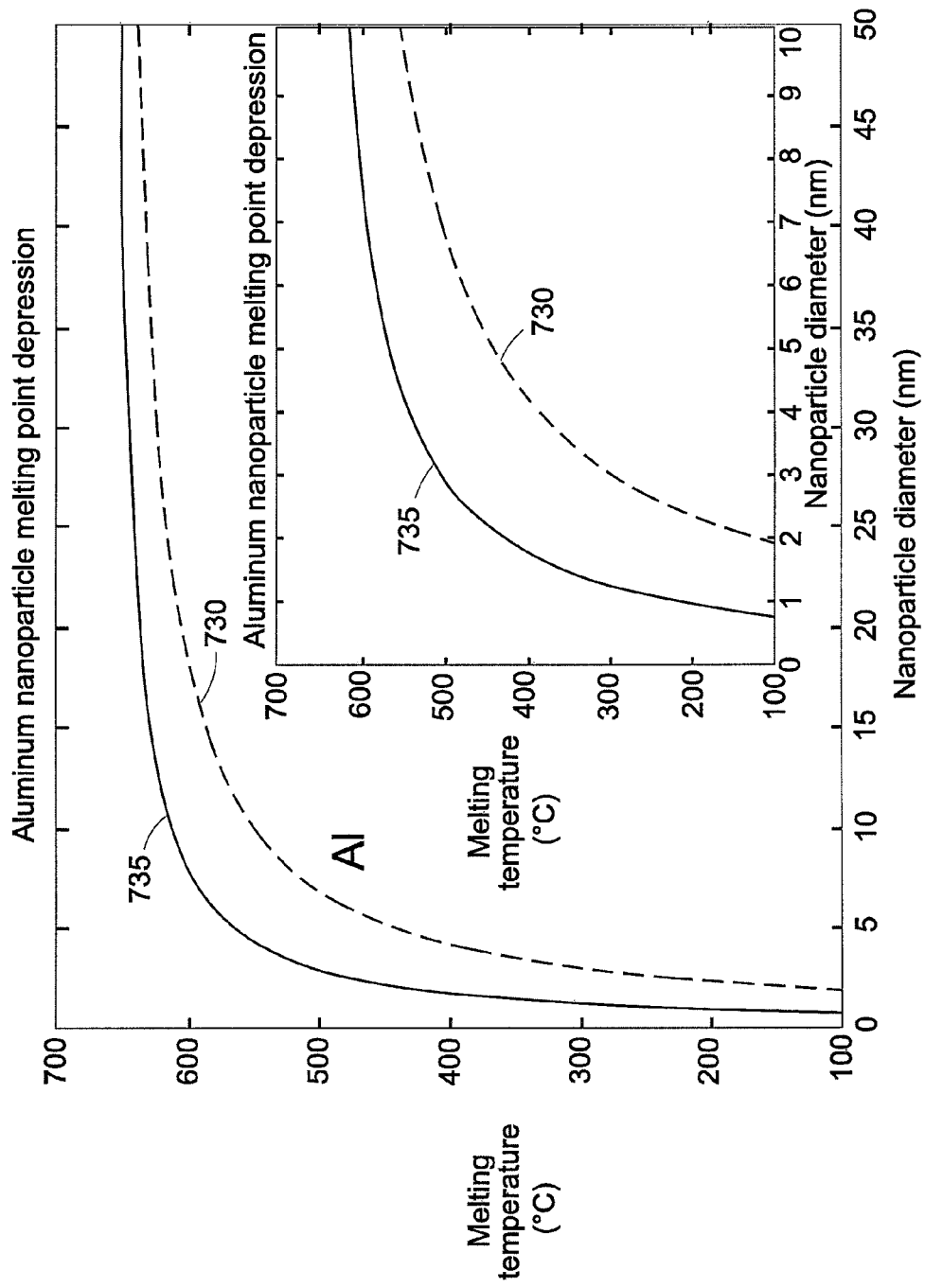

FIG. 7A is a graph showing two plots 710 and 715 approximating the melting temperature of copper versus nanoparticle diameter. The first plot 710 is based on a liquid drop model and the second plot 715 is based on an effective coordination number module. FIG. 7B is a graph showing two plots 730 and 735 approximating the melting temperature of aluminum versus nanoparticle diameter. The first plot 730 is based on the liquid drop model and the second plot 735 is based on the effective coordination number module. As shown in FIGS. 7A and 7B, both models predict melting point depressions for copper and aluminum, characterized by a drop in the respective melting temperature with a reduction in nanoparticle diameter. Similar results can be shown for other metals.

The low fusion temperature (e.g., 200° C. or lower) of the metal shell 104 allows the metal shell 104 to fuse with the metal shells of neighboring composite nanoparticles and to the surface of a heat source or heat-removing device (e.g., heat sink) at low temperatures compared with the melting temperature of the corresponding non-nanoparticle or bulk metal. The metal shell 104 may make up 30-50% by volume of the composite nanoparticle 100 and the diamond core 102 may make up about 50-70% by volume of the composite nanoparticle 100. An amount of less than 30% for the metal shell 104 may lead to an increasingly porous thermal interface with less bonding and reduced mechanical integrity.

Figure 2:
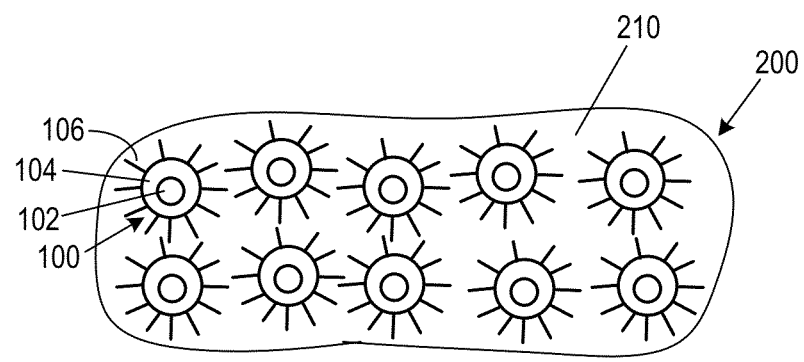
FIG. 2 is a conceptual illustration of a thermal interface material according to an aspect of the present disclosure.

FIG. 2 illustrates an exemplary thermal interface material 200 according to certain aspects of the disclosure. The thermal interface materials 200 comprises metal-diamond composite nanoparticles 100. Each of the composite nanoparticles 100 may have the metal shell/diamond core structure illustrated in the example in FIG. 1. The thermal interface material 200 may also comprise a solvent 210 (e.g., organic solvent) mixed with the composite nanoparticles 100 to form a "paint-like" solution or paste. The surfactant coatings 106 of the composite nanoparticles 100 may comprise organic surfactants to make the nanoparticles 100 soluble in organic solvents. Examples of suitable solvents include dodecanoic acid, triethanolamine, isopropanol (IPA), other solvents or a combination thereof. The volume fraction of the solvent 210 in the thermal interface material 200 may be selected based on a desired viscosity for the thermal interface material 200. Other materials (e.g., paraffin wax and organic acids) may also be added to achieve a desired viscosity or other property for the thermal interface material 200.

Those skilled in the art will appreciate that FIG. 2 is not drawn to scale and that the composite nanoparticles 100 shown in FIG. 2 are greatly enlarged for ease of illustration. Further, although the composite nanoparticles 100 are shown in FIG. 2 to have approximately the same diameter, the composite nanoparticles 100 may have a range of different diameters. Also, the solvent 210 is not depicted at the molecular level in FIG. 2 since the structures of the exemplary solvents discussed above are known.

FIGS. 3A to 3D illustrate an exemplary process for forming a thermal interface between a surface 301 of a heat source 302 and a surface 303 of a heat-removing device 304 using the thermal interface material 200. The heat source 302 may be a heat-generating electronic component including a processor chip, a power amplifier chip or other heat-generating electronic component. For the example where the heat source 302 is a semiconductor chip, the surface 301 of the heat source 302 may be the back surface of the semiconductor chip with integrated circuits on the front surface of the chip. The heat source 303 may also be part of an engine (e.g., automobile engine), a satellite component or other heat-generating component. The surface 301 of the heat source 302 may comprise metal, semiconductor material (e.g., silicon) or other material.

The heat-removing device 304 may include a heat sink, heat pipes or other heat-removing device. For the example where the heat-removing device 304 is a heat sink, the heat sink may include an array of fin-like structures to dissipate heat through convection. The surface 303 of the heat-removing device 304 may comprise metal including copper, aluminum, metal alloy or other metals. Although the surfaces 301 and 303 of the heat source 302 and the heat-removing device 304, respectively, are shown as being planar surfaces in FIGS. 3A to 3D, the surfaces 301 and 303 may have other shapes. For example, the surface 303 of the heat-removing device 304 may be curved for the example of heat pipes.

Figure 3A:
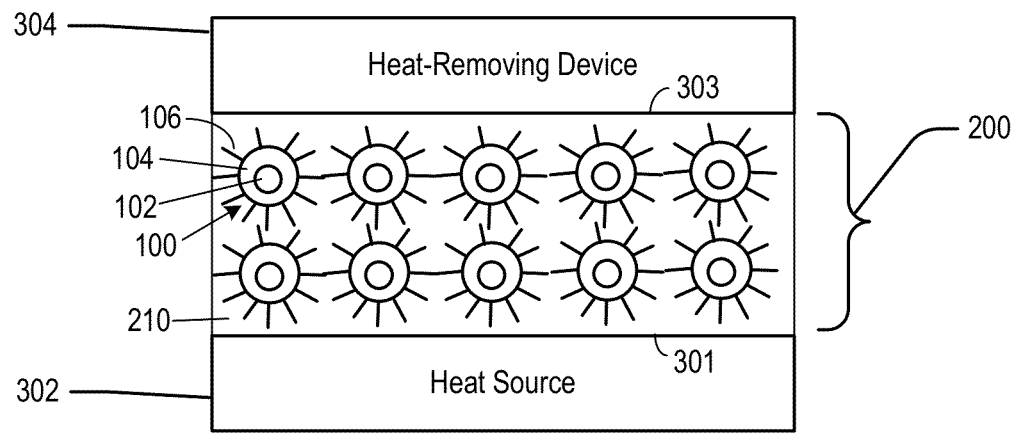
FIG. 3A is a conceptual block diagram illustrating application of a thermal interface material between a heat source and a heat-removing device according to an aspect of the present disclosure.

FIG. 3A shows a conceptual cross-sectional view of a thermal interface material 200 applied between the surfaces 301 and 303 of the heat source 302 and the heat-removing device 304, respectively. For example, the thermal interface material 200 may be coated on the surfaces 301 and 303 of the heat source 302 and heat-removing device 304, respectively, using a brush, a sprayer or other applicator. The coated surface 303 of the heat-removing device 304 may then be placed on the coated surface 302 of the heat source 302. Before application of the thermal interface material 200, the surfaces 301 and 302 of the heat source 302 and the heat-removing device 304, respectively, may be cleaned to remove thin native oxide layers that may be present on the surfaces 301 and 302. Alternatively or in addition, the solvent 201 of the thermal interface material 200 may be selected to etch away the native oxide layers.

Figure 3B:
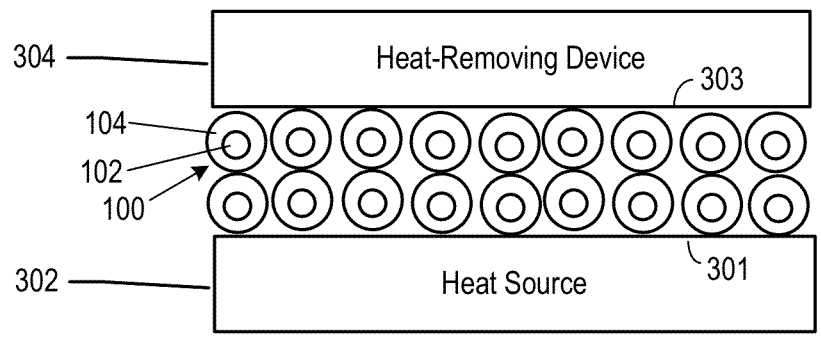
FIG. 3B is a conceptual block diagram illustrating the thermal interface material in FIG. 3A, in which solvents and surfactants have been evaporated out of the thermal interface material, according to an aspect of the present disclosure.

The thermal interface material 200 is then heated to the fusion temperature of the metal shells 104 of the composite nanoparticles 100. The thermal interface material 200 may be heated using a laser, a rapid thermal annealing (RTA) system or other well known heating technique. FIG. 3B illustrates the thermal interface material 200 after heating has started. In the example in FIG. 3B, the solvent 210 and the surfactant coatings 106 of the composite nanoparticles 100 have been evaporated out of the thermal interface material 200 due to the heating, exposing the metal shells 104 of the composite nanoparticles 100. Because the solvent 210 and the surfactant coatings 206 have been evaporated out of the thermal interface material 200, the surfaces 301 and 302 of the heat source 302 and the heat-removing device 304 may be physically closer to each other in comparison with FIG. 3A.

Figure 3C:
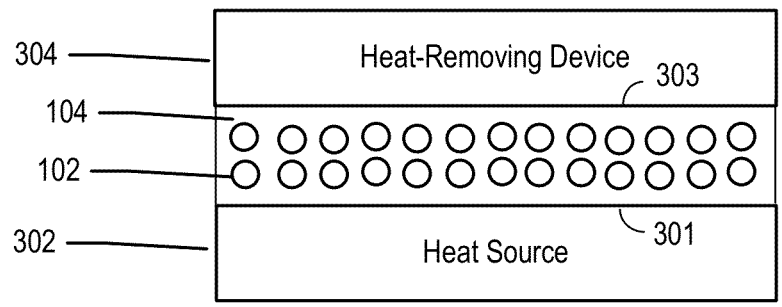
FIG. 3C is a conceptual block diagram illustrating the thermal interface material in FIG. 3B, in which metal shells in the thermal interface material have been liquefied, according to an aspect of the present disclosure.

FIG. 3C illustrates the thermal interface 200 after the metal shells 104 of the composite nanoparticles 100 have liquefied due to heating at the fusion temperature. The liquefied metal shells 104 flow into the voids between the surfaces 301 and 303, filing in the voids and therefore preventing the voids from increasing thermal resistance between the surfaces 301 and 302. Capillary forces of the liquefied metal shells 104 hold the two surfaces 301 and 303 together.

The thermal interface 200 may be heated at the fusion temperature for one to several minutes. The liquefied metal shells 104 fuse together and to the surfaces 301 and 303 of the heat source 302 and the heat-removing device 304, respectively, forming a thermal interface 310 between the surfaces 301 and 302. The relatively low fusion temperature of the metal shells 104 helps ensure that temperatures used for the fusion process do not damage the heat source 302 and/or the heat-removing device 304.

Figure 3D:
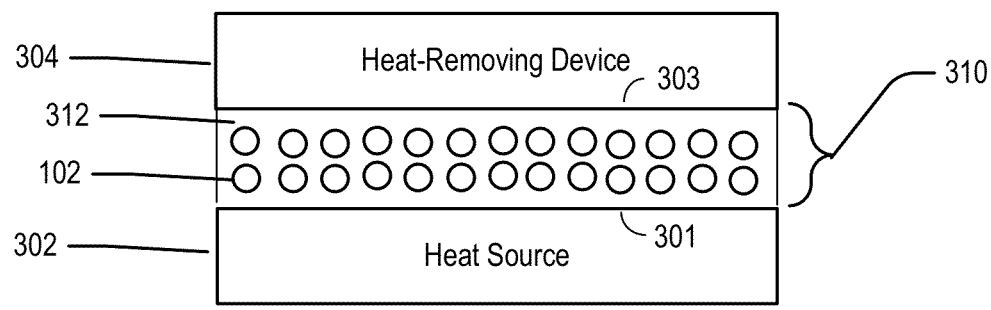
FIG. 3D is a conceptual block diagram illustrating a thermal interface formed after the thermal interface material in FIG. 3C has cooled according to an aspect of the present disclosure.

FIG. 3D illustrates the resulting thermal interface 310 between the surfaces 301 and 303 of the heat source 302 and the heat-removing device 304, respectively. The thermal interface 310 comprises a metal layer 312 formed by the fusion of the metal shells 104 of the composite nanoparticles 100. The thermal interface 310 also comprises the diamond cores 102 embedded within the metal layer 312. Thus, the fused metal shells 104 function as a glue that bonds the high thermally conductive diamond cores 102 to the surfaces 301 and 303 of the heat source 302 and the heat-removing device 304.

The high thermal conductivity (e.g., 2000 W/m·K) of the embedded diamond cores 102 greatly enhances the thermal conductivity of the thermal interface 310. The embedded diamond cores 102 may make up about 50-70% by volume of the thermal interface 310 depending on the shell/core ratio of the nanoparticles 100 used to form the thermal interface 310.

The metal atoms of the metal layer 310 may be arranged in a bulk lattice structure due to fusion, and therefore the metal layer 310 may have the same melting temperature as non-nanoparticle or bulk metal (e.g., 1083° C. for copper). This prevents the thermal interface 310 from melting due to heat transfer through the thermal interface 310. The metal layer 310 also has strong metallurgical bonds to the surfaces 301 and 302 of the heat source 303 and the heat-removing device 304, respectively, due to fusion. The metallurgical bonds can withstand vibrations and shock, making the thermal interface 310 resistant to vibrations and shock. For the example where the heat-removing device 304 comprises metal, the metal layer 310 forms a strong metal-to-metal bond with the heat-removing device 304. For the example where the heat source 302 comprises silicon (e.g., silicon chips), the liquefied metal shells diffuse into a thin layer of the silicon forming a graded silicide layer that bonds the metal layer 310 to the silicon of the heat source 302.

Thus, thermal interface materials according to various aspects of the disclosure provide thermal interfaces with high thermal conductivities, which increase the efficiency of heat removal from heat sources. The increased efficiency of heat removal allows for increased component packing density and reductions in the size and weight of heat-removing devices (e.g., heat sinks).

The thermal interface materials according to various aspects of the disclosure also provide good thermal contact with non-planar surfaces (e.g., rough surfaces) of heat sources and/or heat-removing devices. This is because, during fusion, the liquefied metal shells 104 are able to conform to the shape of a non-planar surface and therefore form a good bond to the non-planar surface throughout a large area of the non-planar surface. This prevents a non-planar surface from forming large voids between a heat source and a heat-removing device, which can significantly increase thermal resistance between the heat source and the heat-removing device.

Figure 4:
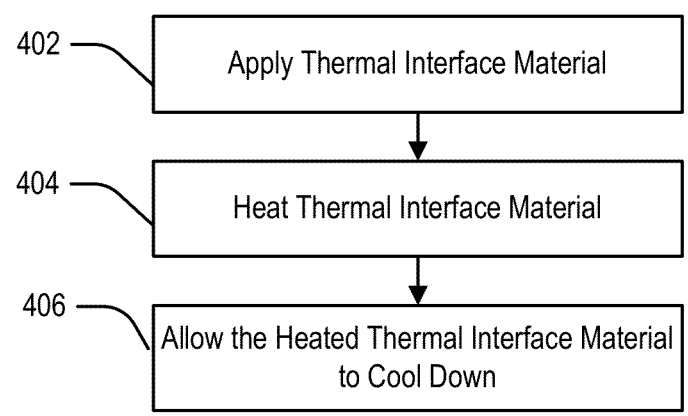
FIG. 4 is a flow chart illustrating an exemplary process for forming a thermal interface between a heat source and a heat-removing device according to an aspect of the disclosure.

FIG. 4 is a flow chart of an exemplary process for forming a thermal interface 310 with high thermal conductivity between the surfaces 301 and 303 of a heat source 302 and a heat-removing device 304, respectively. In step 402, a thermal interface material 200 is applied between the surfaces 301 and 303 of the heat source 303 and the heat-removing device 304, respectively. The thermal interface material 200 may comprise composite nanoparticles 100, in which each composite nanoparticle 100 has a metal shell/diamond core structure, as described with respect to FIG. 1. The thermal interface material 200 may also comprise a solvent and/or other materials to give the thermal interface material 200 a desired viscosity for applying the thermal interface material 200.

In step 404, the thermal interface material 200 is heated to a fusion temperature of the metal shells 104 of the composite nanoparticles 100. The heating causes the solvent 210 and the surfactant coatings 206 of the composite nanoparticles 100 to evaporate out of the thermal interface material 200, allowing the metal shells 104 of the composite nanoparticles to fuse together and to the surfaces 301 and 303 of the heat source 303. The heating may be achieved, for example, with a conventional oven or a more advanced laser. The thermal interface material 200 may be heated at the fusion temperature for a relatively short time period of one to several minutes. The heating time can be as short as one minute or less and up to 10 minutes. The heating time for a particular application may depend on particle size and surfactants used with smaller particles and more volatile surfactants needing shorter heating times.

In step 406, the heated thermal interface material 200 is allowed to cool down. This results in a thermal interface 310 comprising a metal layer 312 formed by the fused metal shells 104 and the diamond cores 102 embedded within the metal layer 312.

Exemplary processes for fabricating thermal interface materials according to various aspects of the disclosure are described below. In one aspect, composite nanoparticles 100 are formed using a "wet chemical" process, as discussed below.

Figure 5:
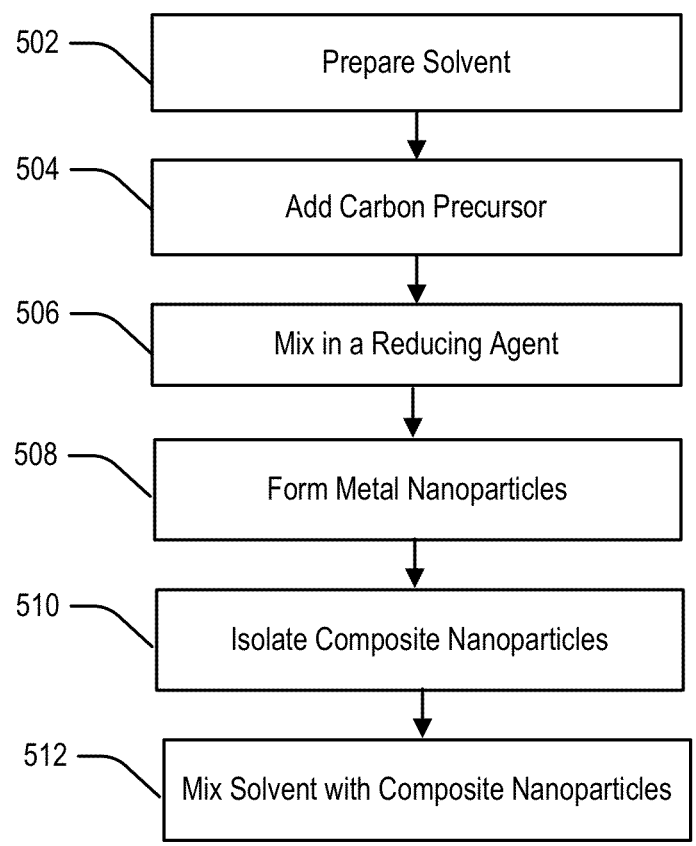
FIG. 5 is a flow chart illustrating an exemplary process for fabricating a thermal interface material according to an aspect of the disclosure.

FIG. 5 is a flow chart illustrating an exemplary "wet chemical" process for fabricating a thermal interface material according to certain aspects of the present disclosure.

In step 502, a solvent is prepared. The solvent acts as a medium in which the subsequent nanoparticle fabrication takes place by reduction processes, as discussed below. Examples of solvents that may be used include tetrahydrofuran (THF), monoglyme, triglyme and other solvents. Additional examples of solvents that may be used can be found in U.S. patent application Ser. No. 11/798,529, titled "Rhenium Nanopartciles," filed on May 15, 2007, the specification of which is incorporated herein by reference.

In step 504, one or more carbon precursors are added to the solvent to form a solution. The carbon precursor dissolves in the solvent and provides the solution with carbon atoms to form carbon nanoparticles. In one aspect, the carbon precursor comprises tetrachloroethylene ($C_2Cl_4$). Examples of other suitable carbon precursors include $CCl_4$, $C_2Cl_6$, and similar compounds where some or all of the chloride atoms are replaced with bromine or iodine atoms.

In step 506, a reducing agent is mixed in with the solution. In one aspect, the reducing agent comprises sodium (Na) dissolved in the solution. The reducing agent reduces the carbon precursor into carbon nanoparticles. The chemical reaction for the formation of carbon nanoparticles, when using ($C_2Cl_4$) as the carbon precursor and sodium as the reducing agent, is shown in Equation (1) below.

$$C_2Cl_4 + 4Na \rightarrow 2nanoC + 4NaCl \quad (1)$$

The chemical reaction results in carbon nanoparticles, represented as nanoC, and sodium chloride (NaCl) as a precipitate.

In step 508, metal nanoparticles are formed in the solution. The metal nanoparticles may be formed by adding a metal precursor to the solution and reducing the metal precursor to form metal nanoparticles using a reducing agent. The metal precursor provides metal atoms to form the metal nanoparticles. Exemplary processes for forming metal nanoparticles in the solution by reducing a metal precursor in the solution are discussed below.

A surfactant may also be added to the solution before the reducing agent to help protect and stabilize the metal nanoparticles formed by the reduction of the metal precursor. The surfactant may protect and stabilize the metal nanoparticles by coating the metal nanoparticles. The surfactant may later be removed by moderate heating or vacuum to expose the metal nanoparticles, allowing the metal nanoparticles to fuse during the fusion process described above. Examples of surfactants that may be used include organic amines, phoshines or sulphur containing organic ligands.

The metal nanoparticles produced by the reduction of the metal precursor bond to the carbon nanoparticles in the solution forming composite nanoparticles 100. For each composite nanoparticle 100, the large radius of curvature of the composite nanoparticle 100 due to the small size of the composite nanoparticle causes a high pressure to develop in the core of the composite nanoparticle 100 via capillary forces. The high pressure, which may be in the GPa range, compresses the carbon in the core of the composite nanoparticle, leading to the formation of a diamond core. High pressure phases (e.g., cubic-bismuth) have been stabilized in the core of nanoparticles at ambient pressure conditions that are otherwise only achievable and stable under very high pressure conditions. Generally speaking, as particle size decreases, diamond becomes more stable than graphite due to the high pressure conditions.

Thus, the introduction of the metal nanoparticles in the solution results in the formation of composite nanoparticles 100 with metal shells 104 formed by the metal nanoparticles and diamond cores 102 formed by the compression of the carbon nanoparticles in the cores of the composite nanoparticles. The small particle sizes of the metal nanoparticles used to form the metal shells 104 decrease the fusion temperature of the metal shells 104, allowing the metal shells 104 to fuse at much lower temperatures than the melting temperature for the corresponding non-nanoparticle or bulk metal.

Steps 502 to 508 of the process may be performed in one reactor or flask. In step 510, after the formation of the composite nanoparticles 100, the composite nanoparticles 100 may be isolated from the solvent used in the reduction processes and the by products of the reduction processes. In 512, the composite nanoparticles 100 may then be mixed with a solvent (e.g., dodecanoic acid or triethanolamine) or other material to form a "paint-like" solution or paste for the thermal interface material 200, as described above.

Various metals may be used to form the metal shells 104 of the composite nanoparticles 100 including copper, silver, gold, aluminum, tin or a combination thereof. The metal nanoparticles used to form the metal shells 104 may be formed in step 508 by reducing a metal precursor for a desired metal into the metal nanoparticles with a reducing agent. For the example of copper nanoparticles, the metal precursor may include copper chloride ($CuCl_2$) and the reducing agent may include sodium (Na) or sodium borohydride ($NaBH_4$). An exemplary reduction process for forming copper nanoparticles is discussed below with reference to FIG. 6.

For the example of silver, silver nitrate ($AgNO_3$), which is a soluble silver salt, may be used for a silver precursor. Less soluble salts may also be used for the silver precursor such as the chloride and others that can be used and dissolved using ammonia solutions because the soluble diamine complex is formed ($[H_3N—Ag—NH_3]+$). For gold, $HAuCl_4$ may be used for a gold precursor as well as $AuCl_3$ or $Au(CO)Cl$. Tin nanoparticles may be prepared from the chloride ($SnCl_4$/$SnCl_2$) or bromide as well as oxo-acid derived tin salts. Aluminum nanoparticles may be formed from the chloride or bromide. The latter is rather electro positive and may require strong reducing agents such as an alkaline metal (Na, K, Li). The metals precursors for the more noble metals may be easily reduced using $NaBH_4$ and even ascorbic acid or citric acid.

In one aspect, thermal interface materials may be fabricated using nano-diamond powder (e.g., available from NanoDiamond Inc.) and metal nanoparticles instead of forming diamond cores in situ. In this aspect, the nano-diamond powder and metal nanoparticles may be mixed with a solvent or other material to form a thermal interface material. The nano-diamond powder may be wetted using a wetting agent. When the thermal interface material is heated to the fusion temperature of the metal nanoparticles, the metal nanoparticles in the thermal interface material fuse together and to the surfaces 301 and 303 of the heat source 302 and heat-removing device 304, respectively. The fused metal nanoparticles form a metal layer bonded to the surfaces 301 and 303 with nano-diamonds embedded in the metal layer for enhanced thermal conductivity.

Figure 6:
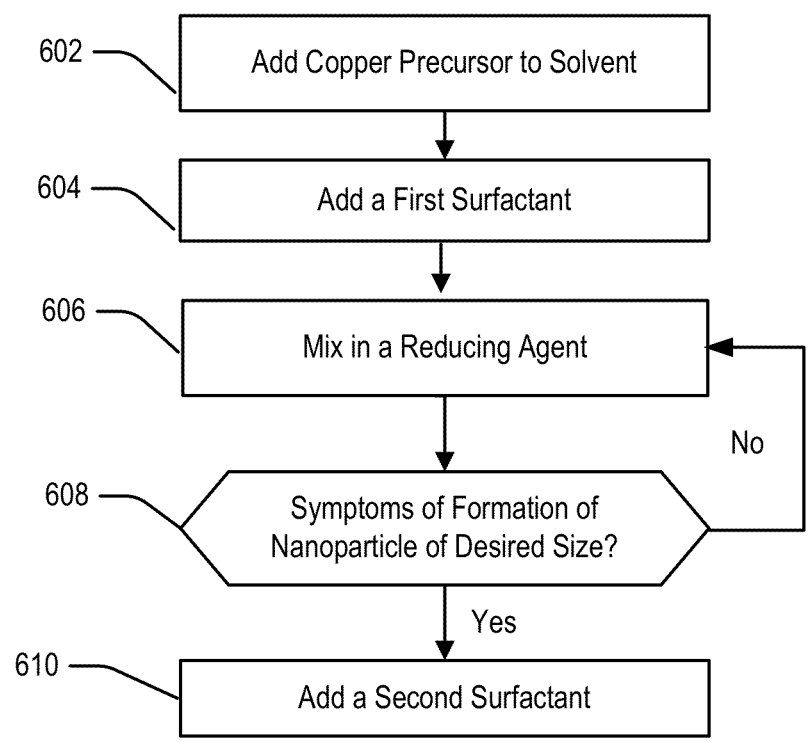
FIG. 6 is a flow chart illustrating an exemplary process for fabricating copper nanoparticles according to an aspect of the disclosure.

FIG. 6 illustrates an exemplary process for forming copper nanoparticles according to various aspects of the disclosure. This process may be used to form copper nanoparticles in step 508, discussed above.

In step, 602, one or more copper precursors are added to a solvent. The solvent THF, glyme or other solvent. The solvent may come from the solution containing the carbon nanoparticles in step 506. Examples of copper precursors include copper chloride ($CuCl_2$), copper oxide (CuO) by dissolution in acid or base with the help of amines (described in U.S. Pat. No. 3,637,508), or copper hydroxide ($Cu(OH)_2$) with ammonia. In certain configurations, copper nanoparticles may be made via the reduction of a suitable copper precursor (salt) such as halide, nitrate, sulfate, acetate, formate, etc.

In certain configurations, a copper precursor requires drying to avoid oxidization of the to-be-formed nanoparticles by moisture and air-oxygen. In certain configurations, in situ drying may be performed. For example, hydrous copper chloride ($CuCl_2*2H_2O$) may be dried using processes that may be represented by the following chemical Equations (2) and (3).

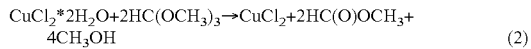

(2)

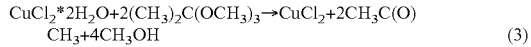

(3)

One skilled in the art will recognize that the chemical reaction above produces anhydrous $CuCl_2$ and, as a side product, a desired anhydrous solvent methanol, thus eliminating time-consuming drying procedures.

In step 604, a first surfactant is added to the solution. The addition of the first surfactant may help control the size of nanoparticles by controlling the range and distribution of diameter sizes of the nanoparticles. In certain configurations, the first surfactant may be chosen from a variety of organic amines having various chain lengths. For copper nanomaterial formation, the amines are chosen, in part, because the amines coordinate well to copper, but at the same time can be removed easily upon moderate heating or vacuum to expose the nanoparticles enabling them to fuse.

In step 606, a reducing agent is mixed in with the solution at a pre-determined mixing rate. The reducing agent may include one or more of lithium (Li), sodium (Na) or potassium (K) with a suitable catalyst. In certain configurations, sodium borohydride ($NaBH_4$) may be used as a reducing agent. The chemical reaction for formation of nanoparticles, represented as nanoCu, when using copper chloride precursor and activated sodium metal as the reducing agent, is shown in Equation (4) below.

(4)

In certain configurations of the present disclosure, copper oxide (CuO) may be used as the precursor, dissolved in a mineral acid or base and citric acid, ascorbic acid or sodium borohydride used as the reducing agent. The chemical reaction when using copper oxide as the copper precursor may be represented by Equations (5a) and (5b) below.

(5a)

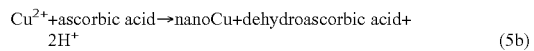

(5b)

In certain configurations, copper chloride ($CuCl_2$) may be used as the copper precursor. When using copper chloride as the copper precursor with sodium borohydride as the reducing agent, the corresponding reaction maybe represented by Equation (6) below.

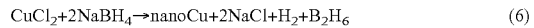

(6)

For example, the reduction of copper chloride with sodium borohydride may be performed by the following process. 1 g of $CuCl_2*2H_2O$ may be dissolved in 45 ml of glyme or THF with 7 g of DDA and 4 g TOP (trioctyl phosphine). Sodium borohydride (19 ml 2M solution) may then be slowly added at room temperature. As soon as the color turns green, 30 ml water with 5-10% DETA and 30 ml hexane with 5-10% n-butylamine may be added and mixed in by stifling for a few minutes. The resulting nanoparticles are hydrophobic and transfer into the organic phase and are extracted and separated from the byproducts. The hexane is readily evaporated to isolate the solid nanoparticles. Somewhat larger nanoparticles can be separated by centrifugation.

In certain configurations, copper nitrate and acetate may be used as the copper precursor and citric or ascorbic acid may be used as the reducing agent. The resulting chemical reaction may be represented by Equation (7) below

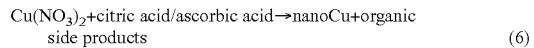

(6)

For example, the reduction of copper acetate with citric or ascorbic acid may be performed by the following process. First, a 50 mL aqueous solution with a concentration of 0.4 M L-ascorbic acid containing 4 g PVP and 8 ml butyl amine and 3 ml DETA is prepared. Then, a 50 mL aqueous solution of 1 g Copper (II) acetate×$1H_2O$ and 1 ml ammonia water (conc) and 8 ml butyl amine and 3 ml DETA and 4 g PVP is prepared resulting in a blue solution ($Cu^{2+}$-ammonia complex). The first solution is then added with the second solution, stirred and heated to +65 C (30 min duration) and allowed to cool back to room temperature. Sodium borohydride (2M solution) is then added (up to 25 drops) until the color starts to change. The resulting nanoparticles are then extracted by either centrifugation or extraction with hexane, as discussed above.

Use of reducing agents that have a relatively high (e.g., having magnitude >2 volts) reduction potential helps in formulation of nanoparticles from electropositive elements. Accordingly, in one aspect, the reducing agent comprises a molecular sodium solution formed in the presence of naphthalene with approximately 2.50 volts reduction potential.

In step 608, the solution is monitored for symptoms of formation of nanoparticles. The symptoms may include change of color of the solution and/or amount of gas being released (bubbling) during the process. For example, when using CuO as the copper precursor, the color of the solution initially is blue-green. After adding the reducing agent, as the reaction proceeds the color changes to dark green indicating formation of nanoparticles followed by yellow and orange-brown, when the nanoparticles begin to grow to larger sizes. Accordingly, in certain configurations, the mixing rate of the reducing agent is held sufficiently low (e.g., 1.5 milliliter per minute) such that the reducing agent is mixed in only while the symptoms of copper nanoparticle formation of a desired size are exhibited. When the symptoms change (e.g., yellow color begins to turn to brown), the mixing of reducing agent may be discontinued.

In certain configurations where $NaBH_4$ is used as the reducing agent (e.g., Equation (6) above), during the formation of nanoparticles gas may be released ($H_2$ and $B_2H_6$) and may be a visible indication that the nanoparticle formation process is occurring.

In step 610, when the symptoms of formation of nanoparticles change (e.g., indicating that nanoparticles of a certain size have formed in the solution), a second surfactant may be added to the solution to facilitate termination of nanoparticle formation or agglomeration. The second surfactant may also help add stability to the nanoparticles formed in the solution by protecting the nanoparticles from further exposure to reacting chemicals and growth. Stabilization and protection of such nanoparticles help stop the nanoparticles from oxidizing and reacting with chemicals in the air when exposed to air oxygen and moisture. Oxidation and chemical reactions are undesirable because exposed nanoparticles can exhibit pyrophoric behavior.

In certain configurations of the present disclosure, organic amines, phosphines, and sulphur containing organic ligands may be used as the second surfactant. The choice of a second surfactant may involve a trade-off between the boiling temperature of a surfactant (the temperature at which the surfactant allows encapsulated nanoparticles to become relatively free) and the predictability of size of nanoparticles. A surfactant that facilitates the fusion process by releasing metal nanoparticles for fusion may be desirable. Accordingly, in one aspect, amines, known to be releasable upon moderate heating, maybe used as the second surfactants. Amines are known to stabilize highly reactive alane ($AlH_3$) and such compounds are commercially available (e.g., $(CH_3)_3N-AlH_3$, $(C_2H_5)_3N-AlH_3$). Other amines possible for use as the second surfactant include n-butyl, hexyl, octyl, dodecyl amine, tripentyl amine, triethylenediamine and ethylene diamine. In certain configurations, phosphines such as tributylphosphine and trioctylphosphine as well as trioctylphosphineoxide may also be used as second surfactants or in combination with an amine. Generally speaking, a phosphine surfactants may exhibit a higher boiling point and may bond more strongly with the nanoparticles and therefore volatilize less readily. In addition, quaternary ionic amines such as tetraoctylammonium bromide and tetraethylammonium bromide may also be used to control nanoparticle size in the early stages of particle growth by covering the nanoparticle surface (weak electrostatic forces) and slowing down agglomeration. In certain configurations, a mixture of surfactants having weaker and stronger bonding characteristics may be used to achieve a balance between the fusion temperature of the resulting nanomaterial and how quickly the process of nanoparticle formation needs to be stopped.

As discussed above, the process for forming copper nanoparticle in FIG. 6 may be performed in step 508 of the process illustrated in FIG. 5. In this aspect, the copper nanoparticles may be formed in the solution containing the carbon nanoparticles to form the metal-diamond composite nanoparticles 100.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

In one aspect, the term "element(s)" may refer to a component(s). In another aspect, the term "element(s)" may refer to a substance(s). In yet another aspect, the term "element(s)" may refer to a compound(s).

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an aspect may refer to one or more aspects and vice versa. A phrase such as an "aspect" does not imply that such aspect is essential to the subject technology or that such aspect applies to all configurations of the subject technology. A disclosure relating to an aspect may apply to all aspects, or one or more aspects. An aspect may provide one or more examples of the disclosure. A phrase such an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A thermal interface material, comprising:
   a plurality of metal-diamond composite nanoparticles, each composite nanoparticle comprising a diamond core surrounded by a continuous metal shell in contact with the diamond core, the metal shell comprising a plurality of metal nanoparticles, the metal nanoparticles having a fusion temperature of less than about 220° C.

2. The thermal interface material of claim 1, further comprising an organic surfactant coating the composite nanoparticles.

3. The thermal interface material of claim 1, wherein each composite nanoparticle comprises about 30% to 50% by volume of the respective metal shell and about 50% to 70% by volume of the respective diamond core.

4. The thermal interface material of claim 1, wherein the metal nanoparticles have a diameter of 20 nanometers or less.

5. The thermal interface material of claim 1, further comprising a solvent mixed in with the plurality of composite nanoparticles.

6. The thermal interface material of claim 5, wherein the solvent is selected from the group consisting of dodecanoic acid and triethanolamine.

7. The thermal interface material of claim 1, wherein the metal shell has a thickness of about 2 nm or less.

* * * * *